US006786968B2

(12) United States Patent
Theil (10) Patent No.: US 6,786,968 B2
(45) Date of Patent: Sep. 7, 2004

(54) METHOD FOR LOW TEMPERATURE PHOTONIC CRYSTAL STRUCTURES

(75) Inventor: Jeremy A. Theil, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 78 days.

(21) Appl. No.: 10/287,040

(22) Filed: Oct. 31, 2002

(65) Prior Publication Data

US 2004/0083948 A1 May 6, 2004

(51) Int. Cl.[7] ............................................... C30B 23/08
(52) U.S. Cl. .......................... 117/93; 117/94; 117/95; 117/935; 427/255.11; 427/255.18; 427/255.28

(58) Field of Search .................. 427/255.11, 255.18, 427/255.28; 117/935, 93, 94, 95

(56) References Cited

U.S. PATENT DOCUMENTS 5,998,298 A  12/1999  Fleming et al.
6,436,488 B1  8/2002  Theil et al.

OTHER PUBLICATIONS

Lee, Ming–Chang Mark, "Nano–Electro–Mechanical Photonic Crystal Switch", Tuesday Afternoon, OFC 2002, pp. 94–95.

Primary Examiner—Robert Kunemund (57) ABSTRACT

A method for making photonic crystal structures using amorphous silicon that is temperature compatible with a wide variety of substrates. Both hydrogenated and non-hydrogenated amorphous silicon may be used.

30 Claims, 11 Drawing Sheets

METHOD FOR LOW TEMPERATURE PHOTONIC CRYSTAL STRUCTURES

BACKGROUND OF THE INVENTION

Photonic crystals have applications in reducing the size of passive waveguide components and potentially leading to new photonic structures such as switches. Photonic crystals may be two dimensional where the photonic crystal and forbidden gap are formed in a single plane or three dimensional where the forbidden gap is formed in two orthogonal planes. Photonic crystals in two dimensions are comparatively easy to fabricate but are lossy because confinement by the two dimensional crystal is only provided in a the single plane. Despite the shortcomings of two dimensional photonic crystals, they are generally viewed as the only way to integrate photonic crystals on semiconductor substrates. Relatively little effort is currently spent on making three dimensional photonic crystals which are typically formed from polycrystalline silicon bars. Polycrystalline silicon has good optical properties with n~3.1 and k~0. Polycrystalline silicon is formed using low pressure chemical vapor deposition (CVD) which is typically operating at temperatures of about 700 degrees Celsius (C) or higher and has a minimum growth temperature of about 600 degrees Celsius. These relatively high temperatures make it difficult to integrate photonic crystals with integrated circuit technology and increase the thermal stress between the substrate and the photonic crystals and are too high for substrates containing aluminum or III–V materials. Typical photonic crystal fabrication relies on micromachining and optics technologies.

BRIEF SUMMARY OF INVENTION

In accordance with the invention, polycrystalline silicon may be replaced by hydrogenated amorphous silicon (a-Si:H) or non-hydrogenated amorphous silicon (a-Si) as a material for fabrication of photonic crystals. Non-hydrogenated amorphous silicon has somewhat higher electromagnetic losses than hydrogenated amorphous silicon. Hydrogenated amorphous silicon or non-hydrogenated amorphous silicon may be formed by plasma enhanced chemical vapor deposition (PECVD) or sputtering, neither of which is dependent on thermal activation.

Hydrogenated amorphous silicon may have its optical properties engineered by controlling the hydrogen content or by substituting elements for Si. Non-hydrogenated amorphous silicon (a-Si) may have its optical properties engineered as well by substituting elements for Si. Reduction of the deposition temperature to the range of about 225–330° C. as disclosed in U.S. Pat. No. 6,436,488 and incorporated by reference, reduces the thermally induced stresses between a-Si:H and the substrate. The reduction in deposition temperature substantially expands the choice of substrates. Compatibility with a wide range of substrates such as silicon, GaAs, InP and glass allows the technology to be used with a variety of devices enabling economies of scale and allows photonic crystals to be integrated into integrated circuit technology.

DETAILED DESCRIPTION OF THE INVENTION

In accordance with the invention, photonic crystals may be formed from hydrogenated amorphous silicon (a-Si:H) or non-hydrogenated amorphous silicon (a-Si) in lieu of polycrystalline silicon. A-Si:H or a-Si may be formed by plasma enhanced chemical vapor deposition (PECVD) or sputtering, neither process being dependent on thermal activation. The use of a-Si:H allows high deposition rates of about 30 Å/sec at temperatures in the range of about 225–330° C. using PECVD as disclosed in U.S. Pat. No. 6,436,488 which is incorporated by reference in its entirety. Non-hydrogenated amorphous silicon is typically deposited using sputtering or PECVD as LPCVD typically requires a temperature (typically 550° C.) that makes use of III–V substrates such as GaAs difficult. The referenced PECVD process deposits amorphous silicon while maintaining the process parameter in a predetermined relationship with a predetermined ratio. The process parameter is typically the ratio of plasma volume to the total flow rate of the mixture of gases.

The optical properties of a-Si:H may be adjusted by controlling the hydrogen content; or for both a-Si:H or a-Si by substituting elements such as Ge, C, Sn, B or P for Si. For example, the refractive index may be varied to adjust the refractive index contrast between the high and low refractive index materials. The reduction of the deposition temperature possible with the use of a-Si:H or a-Si reduces thermally induced stresses between the hydrogenated or non-hydrogenated amorphous silicon and the substrate. The reduction of the deposition temperature allows a wide variety of substrates such as GaAs, InP, Si, SiGe, AlGaAs, $SiO_2$ or borosilicate glass to be used. Compatibility with a wide range of substrates allows one technology to used with many different types of devices to allow economies of scale in accordance with embodiments of the invention. Both three dimensional and two dimensional photonic crystals may be formed using a-Si:H or a-Si.

Figure 1A:
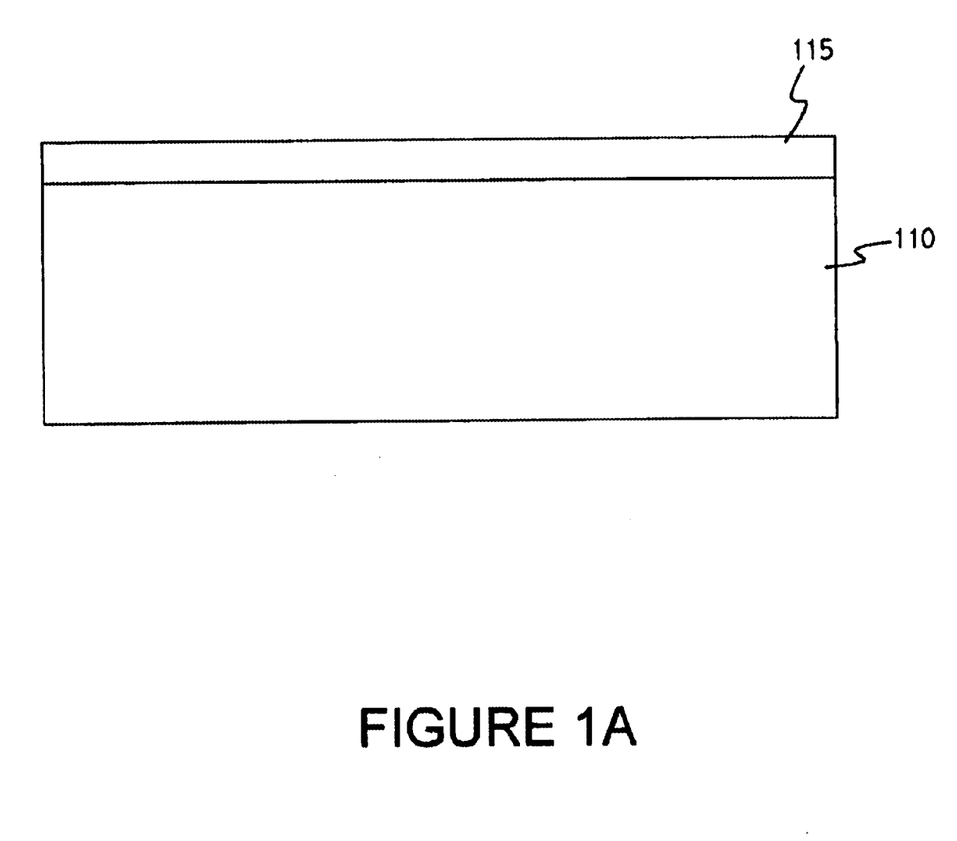
FIGS. 1a–f show the steps of an embodiment in accordance with the invention for making a three-dimensional photonic crystal at low temperature.
Figure 1B:
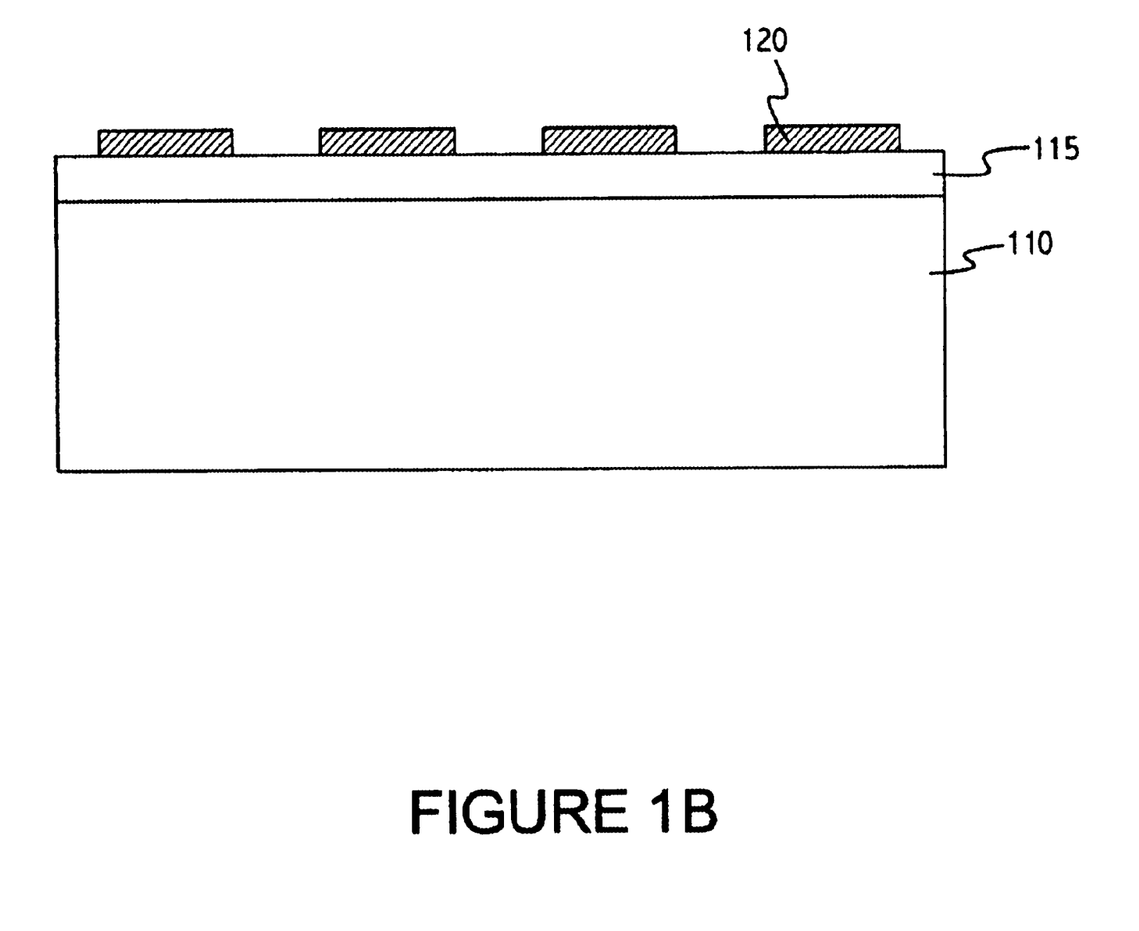
Figure 1C:
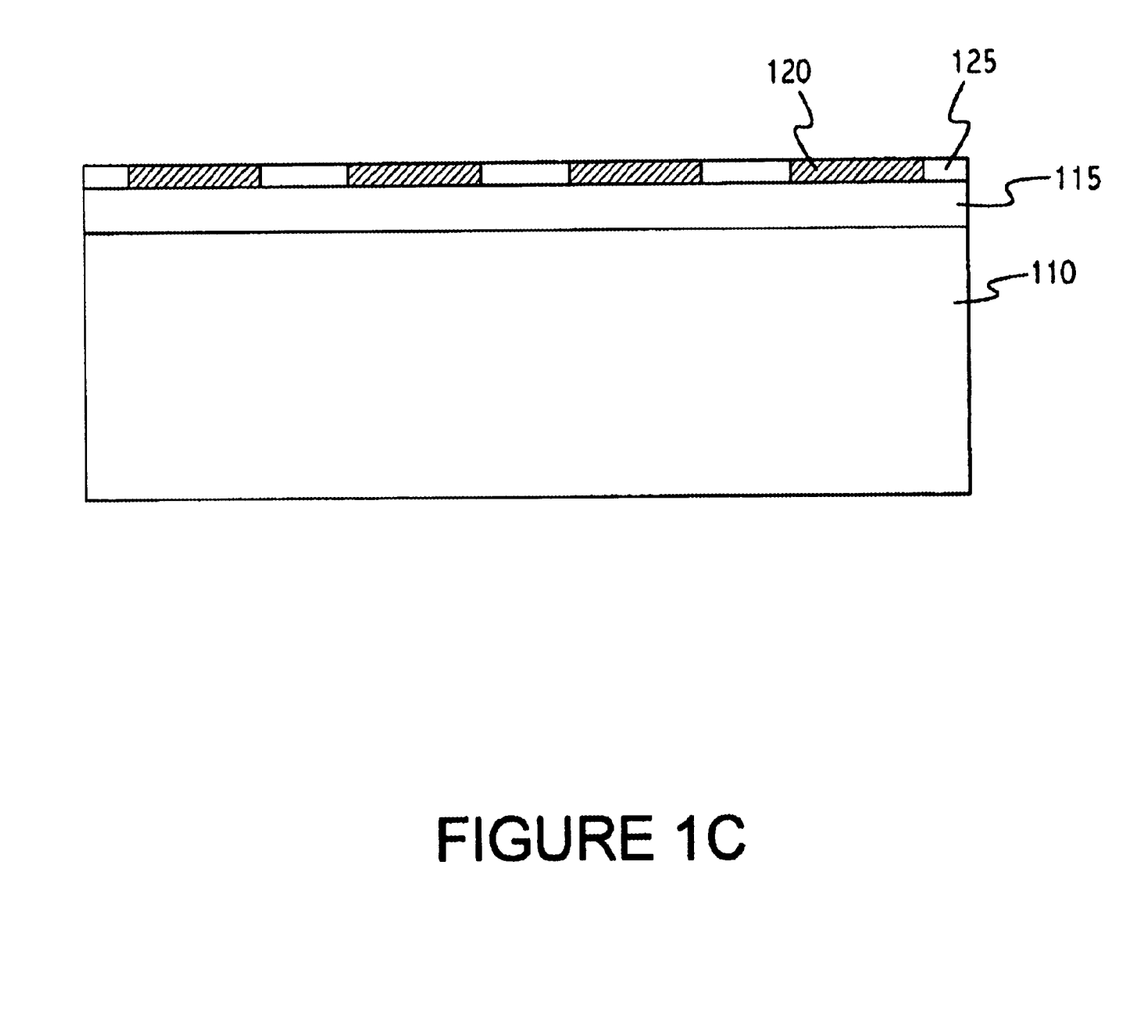
Figure 1D:
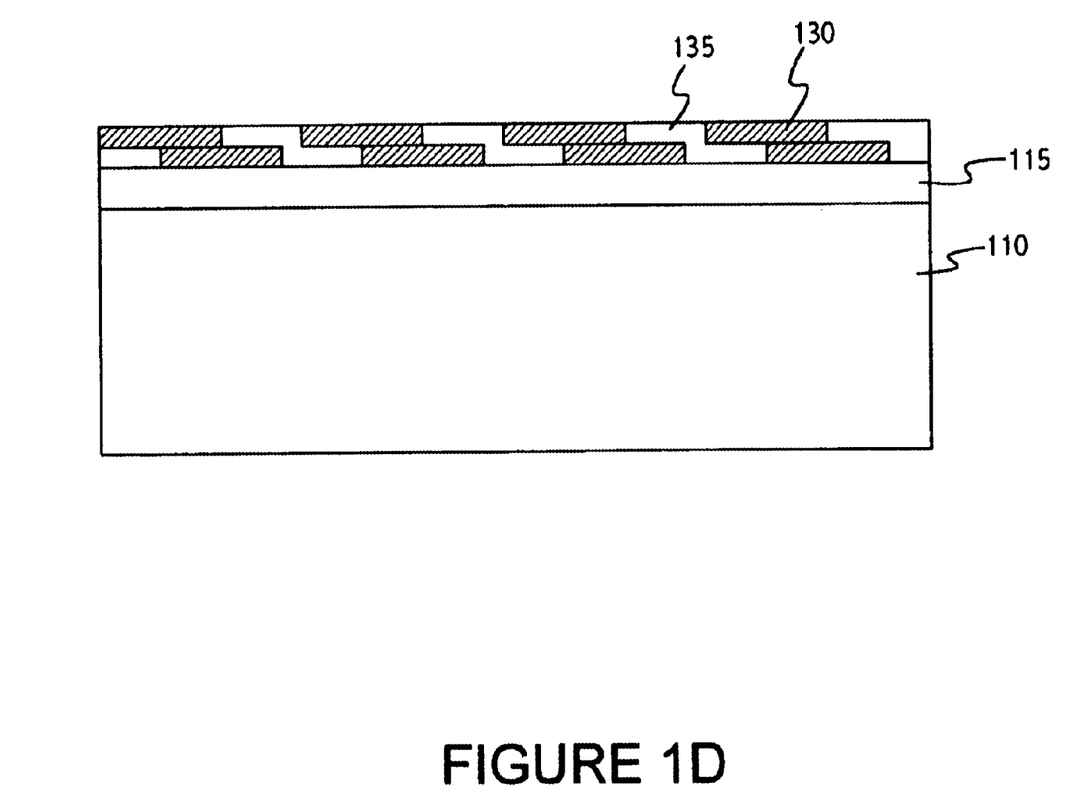
Figure 1E:
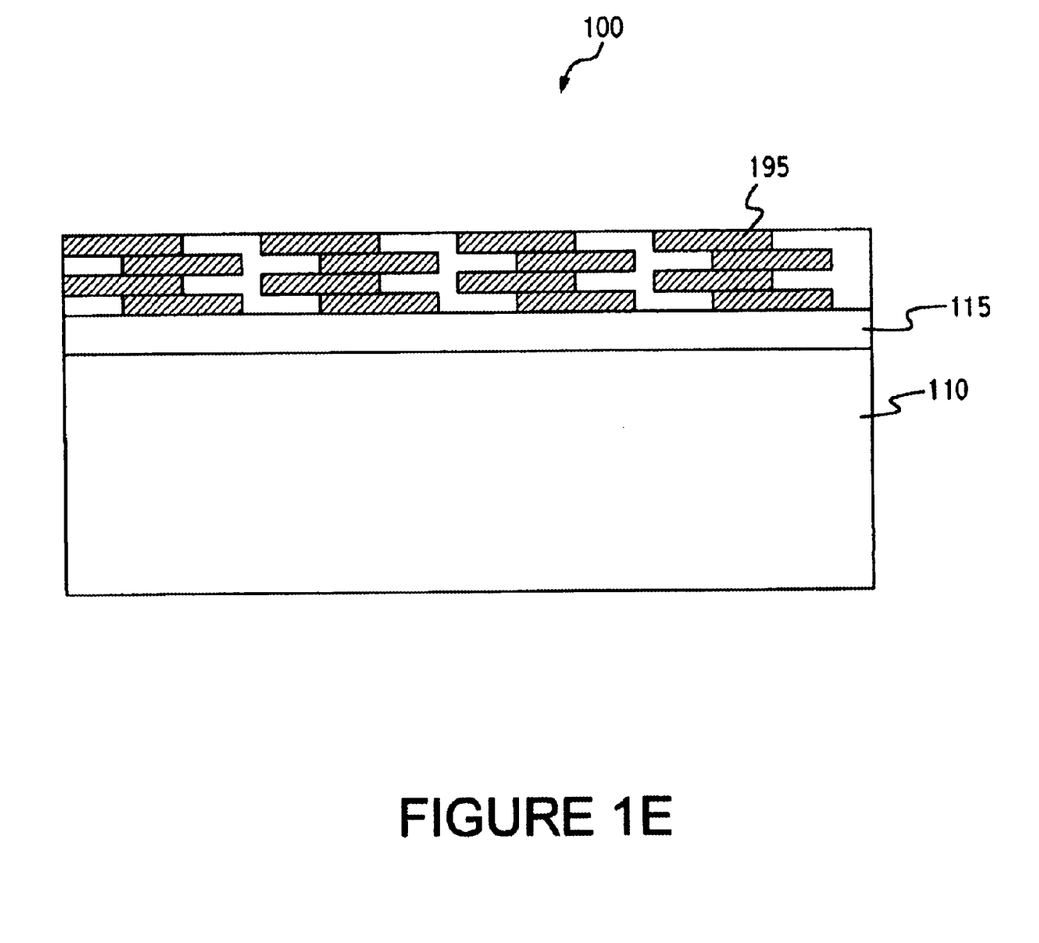
Figure 1F:
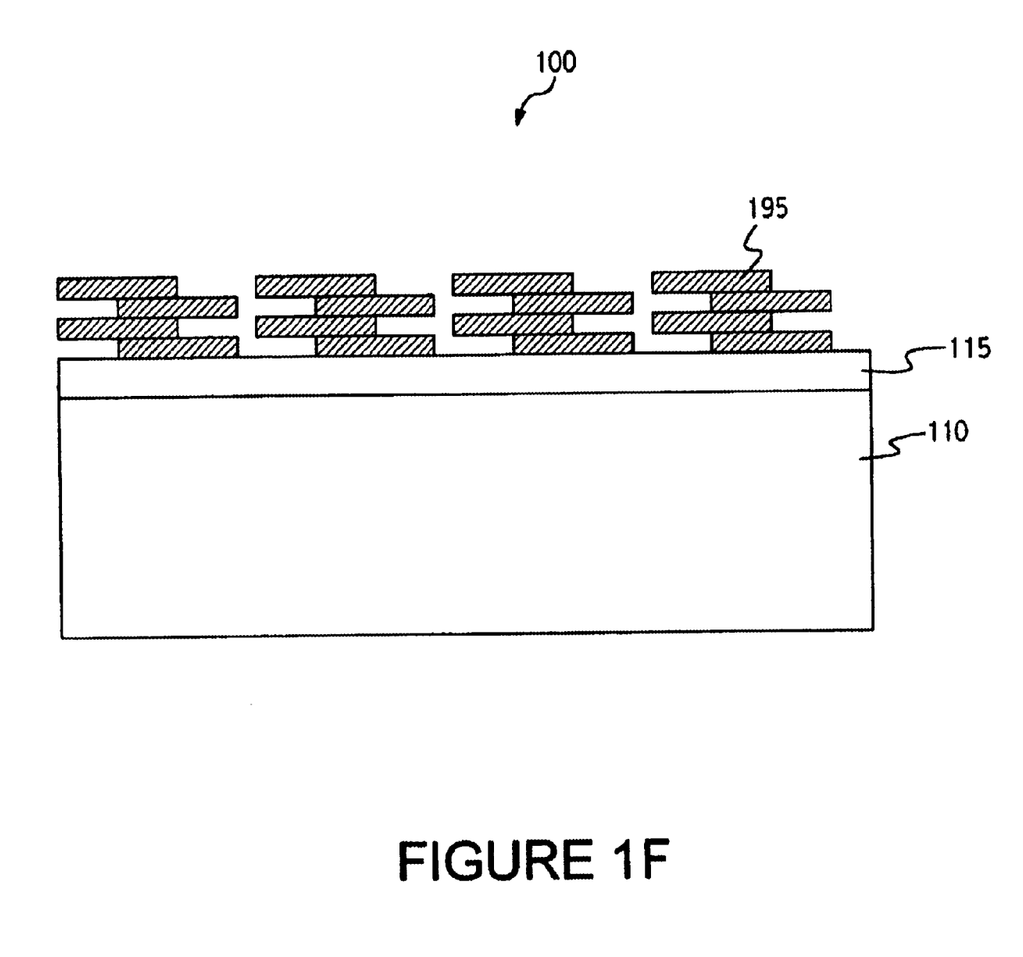

FIGS. 1a–f show the steps in accordance with an embodiment of the invention for fabricating three dimensional photonic crystal 100 (see FIG. 1f). FIG. 1a shows substrate 110 which may be a silicon integrated circuit, for example. Adhesion layer 115 protects underlying substrate 110 and also serves to keep photonic crystal structure 195 fastened to the surface of substrate 110. A typical material for adhesion layer 115 is silicon nitride is typically deposited to a thickness in the range of about 1000 Å–10 μm.

FIG. 1b shows deposited and patterned a-Si:H or a-Si layer 120. A Si:H or a:Si layer 120 is deposited using PECVD as disclosed in U.S. Pat. No. 6,436,488 which is incorporated by reference or is deposited by using sputtering, see for example, Aida et al., "Light induced defects in sputtered amorphous silicon films", Materials Chemistry and Physics 74 (3): 251–257, Apr. 1, 2002. A suitable photomask is deposited and patterned before etching a-Si:H or a-Si layer 120 typically using a dry etchant, for example, $BCl_3$ or $Cl_2$ etch. The minimum feature size and pitch of the structures are limited only by the lithographic capability of the patterning technique.

FIG. 1c shows deposition of oxide filler 125, typically by PECVD using tetraethylorthosilicate (TEOS) or $SiH_4$ with $N_2O$ or $O_2$ as the oxygen source to make silicon oxide, to planarize the surface of etched a-Si:H or a-Si layer 120 and provide sacrificial material for later removal. Alternatively, a thermal process known as "ozone TEOS" can also be used to create silicon oxide films although the resulting layer is typically more difficult to polish. Because the resulting film by the ozone TEOS process is less homogeneous, the subsequent chemical-mechanical polishcan be more problematic, for example, causing seams to open up. Filler 125 and a-Si:H or a-Si layer 120 are polished to provide a planar surface for further deposition of a-Si:H or a-Si.

FIG. 1d shows deposition of a-Si:H or a-Si layer 130 followed by a patterned etch and deposition of additional oxide filler 125 with subsequent polishing. FIG. 1d is a repetition of the steps shown in FIGS. 1b and 1c to form a photonic crystal unit cell. This process is repeated until desired photonic crystal structure 195, as exemplarily shown in FIG. 1e, is created. Finally, oxide filler 125 is removed using typically using a hydrofluoric acid (HF) wet dip or a dry HF process and photonic crystal 195 is left attached to substrate 110 resulting in three-dimensional photonic crystal structure 100 shown in FIG. 1f.

Figure 2A:
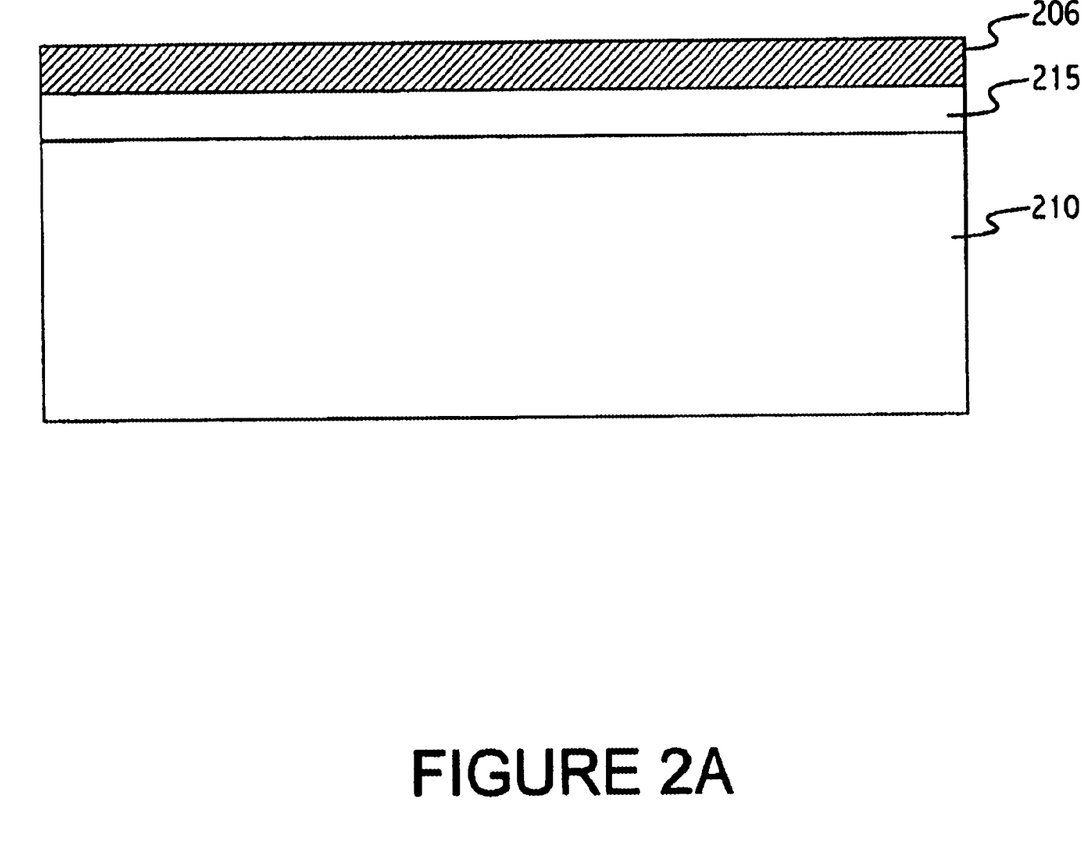
FIGS. 2a–e show the steps of an embodiment in accordance with the invention for making a two-dimensional photonic crystal at low temperature.

An alternative method to finishing off photonic crystal structure 100 is to go directly to the oxide filler removal step after the final a-Si:H or a-Si layer has been patterned. This eliminates the last silicon oxide deposition and polishing step, simplifying the process FIGS. 2a–e show the steps in accordance with an embodiment of the invention for fabricating two-dimensional photonic crystal structure 200 (see FIG. 2d). FIG. 2a shows substrate 210 which may be a silicon integrated circuit, for example. Adhesion layer 215 protects underlying substrate 210 and also serves to keep photonic crystal structure 295 fastened to the surface of substrate 210. A typical material for adhesion layer 215 is silicon nitride is typically deposited to a thickness in the range of about 1000 Å–10 μm. To tailor optical confinement it may be desirable to deposit suitably doped a-Si:H or a-Si layer 206 over adhesion layer 215 before proceeding to the next step. If the top confinement layer is air then layer 206 is typically omitted.

Figure 2B:
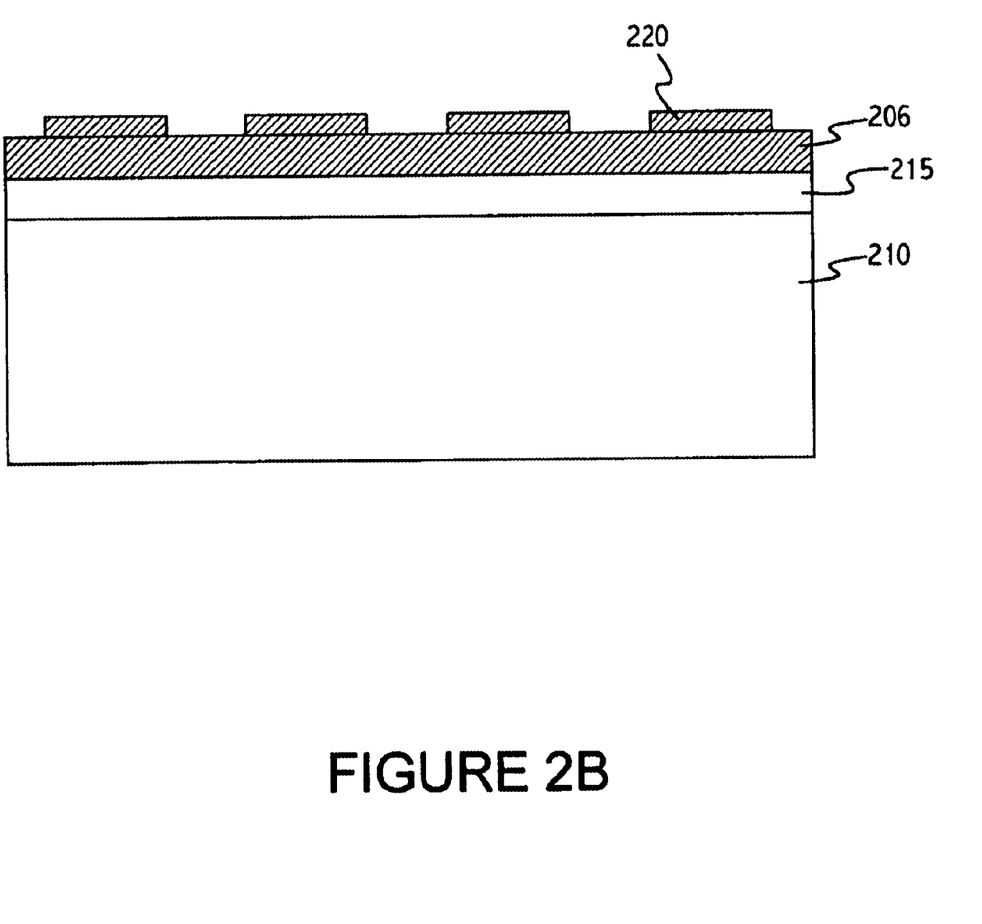

FIG. 2b shows deposited and patterned a-Si:H layer 220. A-Si:H or a-Si layer 220 is deposited using PECVD as disclosed in U.S. Pat. No. 6,436,488 which is incorporated by reference or is deposited by using sputtering, see for example, Aida et al., "Light induced defects in sputtered amorphous silicon films", Materials Chemistry and Physics 74 (3): 251–257, Apr. 1, 2002. A suitable photomask is deposited and patterned before etching a-Si:H or Si:H layer 220 typically using a dry etchant, for example, $BCl_3$ or $Cl_2$ etch. The minimum feature size and pitch of the structures are limited only by the lithographic capability of the patterning technique employed. If the top confinement layer is to be air, processing is complete here and layer 206 will typically not have been deposited.

Figure 2C:
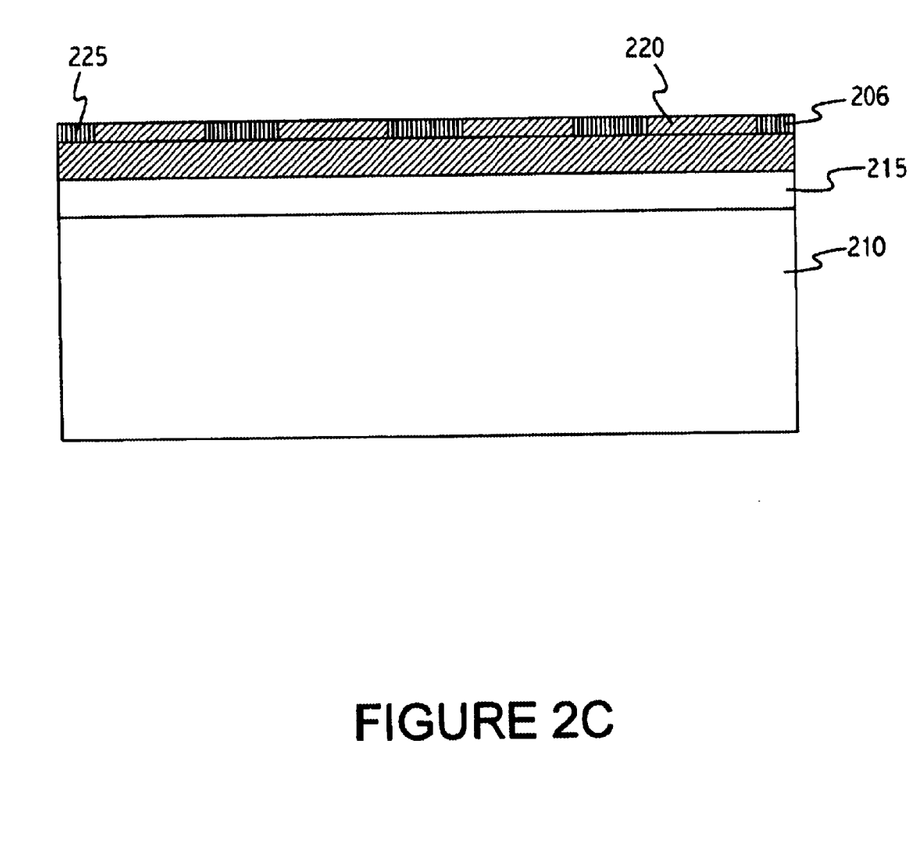
Figure 2D:
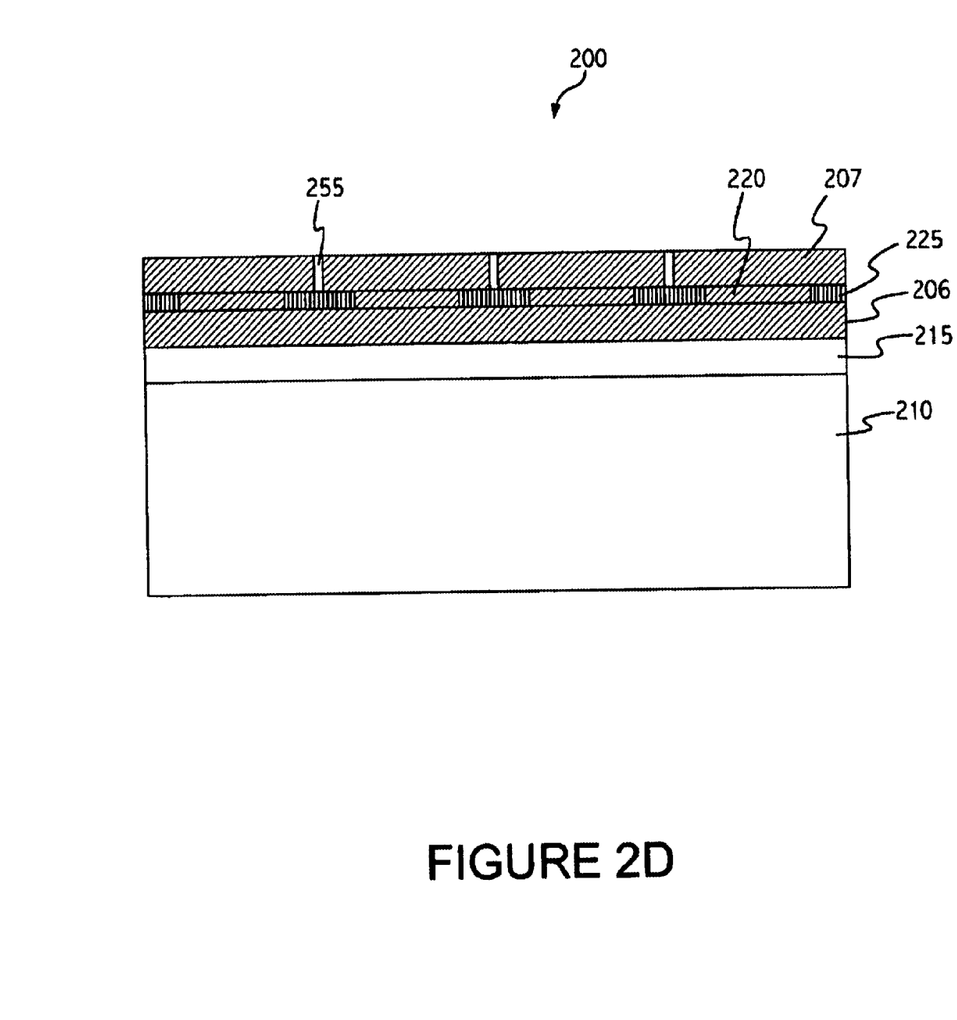

FIG. 2c shows deposition of oxide filler 225, typically by PECVD using tetraethylorthosilicate (TEOS) or $SiH_4$ with $N_2O$ or $O_2$ as the oxygen source to make silicon oxide, to planarize the surface of etched a-Si:H or a-Si layer 220 and provide sacrificial material for later removal. Alternatively, a thermal process known as "ozone TEOS" can also be used to create silicon oxide films although the resulting layer is typically more difficult to polish. Because the resulting film is less homogeneous, the subsequent chemical-mechanical polish can be more problematic, for example, causing seams to open up. Filler 225 and a-Si:H or a-Si layer 220 are polished to provide a planar surface for further deposition of a-Si:H or a-Si layer 207 shown in FIG. 2d. Layer 207 is patterned to have trenches or holes 255 sufficiently large to allow the etchant to physically access oxide filler 225 but still small enough to provide the desired degree of optical confinement.

Figure 2E:
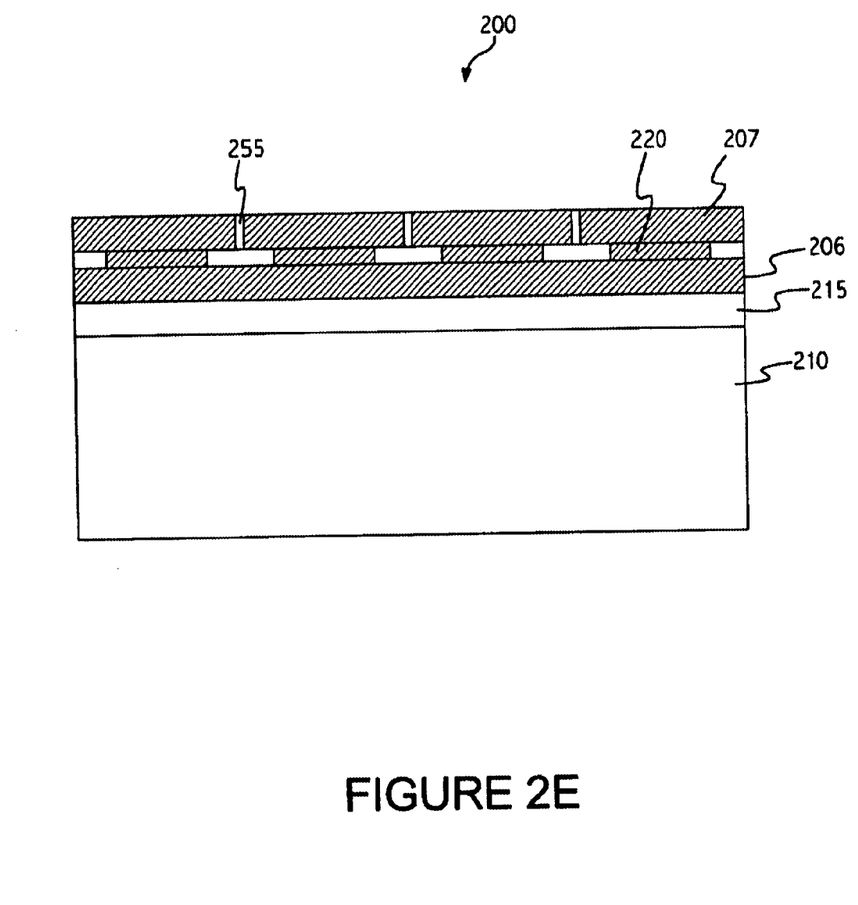

Finally, oxide filler 225 is removed, typically using a hydrofluoric acid (HF) wet dip or a dry HF process and photonic crystal 295 is left attached to substrate 210 resulting in two-dimensional photonic crystal structure 200 shown in FIG. 2e.

Typically, the layout of the patterned a-Si:H or a-Si layers should be such that all of oxide filler 125 or 225 in each layer form a continuous oxide path to the upper exposed layer of photonic crystal structures 100 or 200, respectively. This allows the penetration of the etch such as the HF wet dip or dry HF process to remove all of oxide filler 125 or 225.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for making a photonic crystal structure at a temperature compatible with a substrate comprising a material selected from the group consisting of III–V compounds, silicon, glass, copper and aluminum, said method comprising:

depositing a first amorphous silicon layer on said substrate at said temperature;

patterning said first amorphous silicon layer to correspond to a first layer of said photonic crystal structure;

depositing a first sacrificial filler layer to planarize said first amorphous silicon layer;

depositing a second amorphous silicon layer on said first amorphous silicon layer;

patterning said second amorphous silicon layer to correspond to a second layer of said photonic crystal structure;

depositing a second sacrificial filler layer to planarize said second amorphous silicon layer; and removing said first and said second sacrificial filler layer from said photonic crystal structure using an etching process.

2. The method of claim 1 wherein said first amorphous silicon layer is a hydrogenated amorphous silicon layer.

3. The method of claim 1 further comprising polishing said first sacrificial filler layer.

4. The method of claim 1 wherein said first amorphous silicon layer is deposited using plasma enhanced chemical vapor deposition.

5. The method of claim 1 wherein said temperature is less than about 330 degrees Celsius.

6. The method of claim 1 wherein said etching process is a hydrofluoric acid wet dip.

7. The method of claim 1 wherein said first sacrificial layer is silicon oxide.

8. The method of claim 1 wherein said first sacrificial layer is deposited using ozone TEOS.

9. The method of claim 1 wherein said first and said second amorphous silicon layers are doped to modify the refractive index.

10. The method of claim 9 wherein said first and said second amorphous silicon layers are doped with boron.

11. The method of claim 1 wherein said material is GaAs.

12. The method of claim 1 wherein said second amorphous silicon layer is deposited using sputtering.

13. The method of claim 1 further comprising deposition of an adhesion layer to said substrate.

14. The method of claim 13 wherein said adhesion layer is silicon nitride.

15. A method for making a two-dimensional photonic crystal structure at a temperature compatible with a substrate comprising a material selected from the group consisting of III–V compounds, silicon, glass and aluminum, said method comprising:

depositing an amorphous silicon layer on said substrate at said temperature; and patterning said amorphous silicon layer to correspond to a layer of said two dimensional photonic crystal structure.

16. The method of claim 15 wherein said material is GaAs.

17. The method of claim 15 wherein said amorphous silicon layer comprises non-hydrogenated amorphous silicon.

18. The method of claim 15 wherein said amorphous silicon layer is deposited using sputtering.

19. The method of claim 15 further comprising deposition of an adhesion layer to said substrate.

20. A method for making a photonic crystal structure at a temperature compatible with a substrate comprising a material selected from the group consisting of III–V compounds, silicon, glass, copper and aluminum, said method comprising:

depositing a first amorphous silicon layer on said substrate at said temperature;

patterning said first amorphous silicon layer to correspond to a first layer of said photonic crystal structure;

depositing a sacrificial filler layer to planarize said first amorphous silicon layer;

depositing a second amorphous silicon layer on said first amorphous silicon layer;

patterning said second amorphous silicon layer to correspond to a second layer of said photonic crystal structure; and removing said sacrificial filler layer from said photonic crystal structure using an etching process.

21. The method of claim 20 wherein said first amorphous silicon layer is a hydrogenated amorphous silicon layer.

22. The method of claim 20 further comprising polishing said sacrificial filler layer.

23. The method of claim 20 wherein said first amorphous silicon layer is deposited using plasma enhanced chemical vapor deposition.

24. The method of claim 20 wherein said temperature is less than about 330 degrees Celsius.

25. The method of claim 20 wherein said etching process is a hydrofluoric acid wet dip.

26. The method of claim 20 wherein said sacrificial layer is deposited using ozone TEOS.

27. The method of claim 20 wherein said first and said second amorphous silicon layers are doped to modify the refractive index.

28. The method of claim 27 wherein said first and said second amorphous silicon layers are doped with boron.

29. The method of claim 20 wherein said second amorphous silicon layer is deposited using sputtering.

30. The method of claim 20 further comprising deposition of an adhesion layer to said substrate.

\* \* \* \* \*